(12) United States Patent
Hammerschmidt

(10) Patent No.: US 8,447,570 B2
(45) Date of Patent: May 21, 2013

(54) PREDICTIVE SENSOR READOUT

(75) Inventor: Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1160 days.

(21) Appl. No.: 12/124,892

(22) Filed: May 21, 2008

(65) Prior Publication Data
US 2009/0290053 A1 Nov. 26, 2009

(51) Int. Cl.
*H03F 1/26* (2006.01)
*H02J 7/00* (2006.01)
*G05B 13/02* (2006.01)

(52) U.S. Cl.
USPC ............................. 702/189; 320/166; 700/44

(58) Field of Classification Search
USPC ............... 702/189, 57, 60, 64–65, 81, 84–85, 702/104, 127, 182–183, 190; 320/137, 139, 320/141, 145, 158, 163, 166; 348/294, E5.091; 703/1, 4; 700/28, 44–45, 52, 55, 73
See application file for complete search history.

(56) References Cited

U.S. PATENT DOCUMENTS

| | | | |
|---|---|---|---|
| 4,654,861 | A | 3/1987 | Godard |
| 2003/0006921 | A1 | 1/2003 | Stetson et al. |
| 2003/0035499 | A1* | 2/2003 | Staszewski et al. ........... 375/346 |

FOREIGN PATENT DOCUMENTS

| | | |
|---|---|---|
| GB | 2265775 | 10/1993 |
| GB | 2289998 | 12/1995 |

OTHER PUBLICATIONS

D. Hammerschmidt, Sensor Sysrtems—Interface between Environment and Application, Sep. 21-23, 1999, Solid-State Circuits Conference, 1999, ESSCIRC '99, pp. 29-36.*
D. Hammerschmidt, Sensor Sysrtems—Interface between Environment and Application, Sep. 21-23, 1999, Solid-State Circuits Conference, 1999, ESSCIRC '99, Abstract.*

* cited by examiner

*Primary Examiner* — Toan Le
(74) *Attorney, Agent, or Firm* — Dicke, Billig & Czaja, PLLC

(57) ABSTRACT

A predictive sensor readout is suitable for coupling to a sensor. The predictive sensor readout includes a sampling circuit, a predictor, and a preset circuit. The sampling circuit is configured to receive and over-sample previously digitized samples of signals previously input from the sensor. The predictor is coupled to the sampling circuit and is configured to receive the over-sampled digitized samples into a signal history and to generate a predicted input from the sensor based on the signal history. The preset circuit is coupled to the predictor and the sampling circuit and is configured to present the sampling circuit to receive the predicted input from the sensor prior to sampling an actual input from the sensor.

24 Claims, 3 Drawing Sheets

PREDICTIVE SENSOR READOUT

BACKGROUND

The present disclosure relates to a sensor readout circuit. More particularly, the present disclosure relates to a sensor readout for use with a sensor, where the sensor readout is predictive of the actual signal from the sensor.

Sensor devices are legion, and are used to directly or indirectly measure the physical properties of interest. In one example, sensors interface with a physical property and produce an analog electrical signal representative of the effect of the physical property on the sensor. Sensors can measure, motion, angular rotation, temperature, pressure, and the like. Automotive sensors can include pressure sensors, Hall Effect sensors, GMR sensors, and so on, which can produce a band limited analog output signal, such as a voltage, through a resistive bridge or an inductive sensor. These analog voltages are often converted to digital signals for further processing of information that sensors can provide regarding the physical property.

A sensor readout circuit is applied to the sensor to selectively read the sensor when requested and to convert the analog signal generated with the sensor to a digital representation of that signal for further processing. A typical sensor readout circuit can include a multiplexer that receives an input from a plurality of sensors and provides a selected input to an analog to digital converter. For example, several sensors are connected to a multiplexer, where each sensor has a dedicated signal channel coupled to the multiplexer. The multiplexer selects a signal channel to pass the corresponding analog signal to the analog to digital converter. The analog to digital converter receives the selected analog signal from the multiplexer and provides an output that is a digital representation of that signal. In order to implement this configuration, however simple it may seem, there requires much consideration of the effects of the circuitry involved so that intermediate circuits between the multiplexer and the analog to digital converter are employed.

In typical sensor readout circuits, sensors as a signal source usually include high impedance and are very sensitive to load currents. Multiplexing several sensors to an analog to digital converter can result in sensors being affected by such load currents. Engineers have solved the issue of load currents by using preamplifiers to decouple the sensors from the circuit and to drive the analog input to the analog to digital converters. Analog to digital converters already occupy a relatively large amount of size on the semiconductor and require a fair amount of power for their operation. Unfortunately, these preamplifier decoupling circuits often also require the same or larger power and area. The required input current to the analog to digital converter is simply too high to permit direct multiplexing between the analog to digital converter and the sensor. Thus size and power consumption improvements are limited with the typical sensor readout circuits.

SUMMARY

A predictive sensor readout suitable for coupling to a sensor is illustrated and described. The predictive sensor readout includes a sampling circuit, a predictor, and a preset circuit. The sampling circuit is configured to receive and over-sample previously digitized samples of signals previously input from the sensor. The predictor is coupled to the sampling circuit and is configured to receive the over-sampled digitized samples into a signal history and to generate a predicted input from the sensor based on the signal history. The preset circuit is coupled to the predictor and the sampling circuit and is configured to present the sampling circuit to receive the predicted input from the sensor prior to sampling an actual input from the sensor.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

The present disclosure provides for a sensor readout that, in one example, can significantly reduces the required input current drawn from the sensors. This can permit direct multiplexing between the analog to digital converter and multiple sensors. Thus, size and power consumption improvements of the sensor readouts can be realized over typical sensor readout circuits.

In the following Detailed Description, reference is made to the accompanying drawings, which form a part hereof, and in which is shown by way of illustration specific embodiments in which the invention may be practiced. In this regard, directional terminology, such as "top," "bottom," "side," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
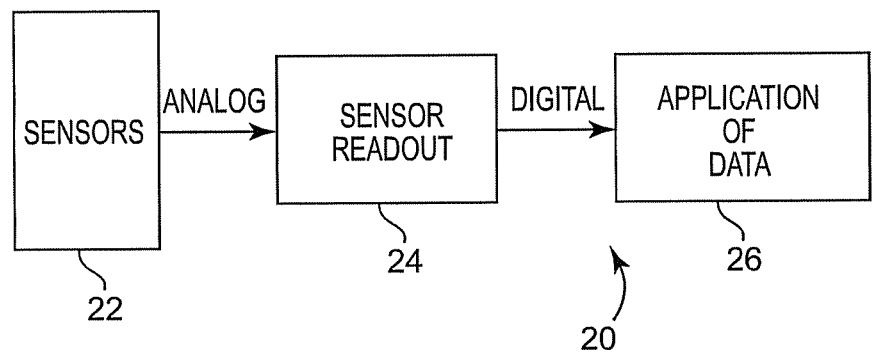
FIG. 1 is schematic view of a semiconductor device having a predictive sensor readout of the present disclosure.

This disclosure relates to devices having a predictive sensor readout. The disclosure, including the figures, describes the semiconductor devices and their operation with reference to several illustrative examples. The present invention, however, could be implemented in other devices or with other operations well. Further, the operation can be implemented with other features or in different order than the operation described below. The present invention is described with respect to the examples illustrated in the figures for illustrative purposes only. Other examples are contemplated and are mentioned below or are otherwise imaginable to someone skilled in the art. The scope of the invention is not limited to the few examples, i.e., the described embodiments of the invention. Rather, the scope of the invention is defined by reference to the appended claims. Changes can be made to the examples, including alternative designs not disclosed, and still be within the scope of the claims FIG. 1 illustrates a general overview of an environment of an example of the present disclosure. FIG. 1 illustrates a system 20, including one or more sensors 22, a readout 24, and a processor 26. The sensor 22 is capable measuring external physical properties like pressure or magnetic fields, such as one of many automotive pressure sensors or Hall Effect sensors. The readout 24 is coupled to one or a plurality of equal or different sensor cells where the readout is capable of reading the signals provided by the sensors, without corrupting the sensor information by loading the sensor outputs with input current to the readout chain. The readout receives the data in an analog form from the sensors and can convert the analog signal, such as a voltage level, into a digital representation of the signal. The processor 26 can be any circuit for transforming or applying the digital sensor data in a usable manner and need not be a microprocessor or the like. The processor receives the digital information from the readout 24 and prepares the signal for use, whatever the appropriate use might be. Examples of the use are to provide the digital signal to an output interface, apply an application to the data, or other use.

Figure 2:
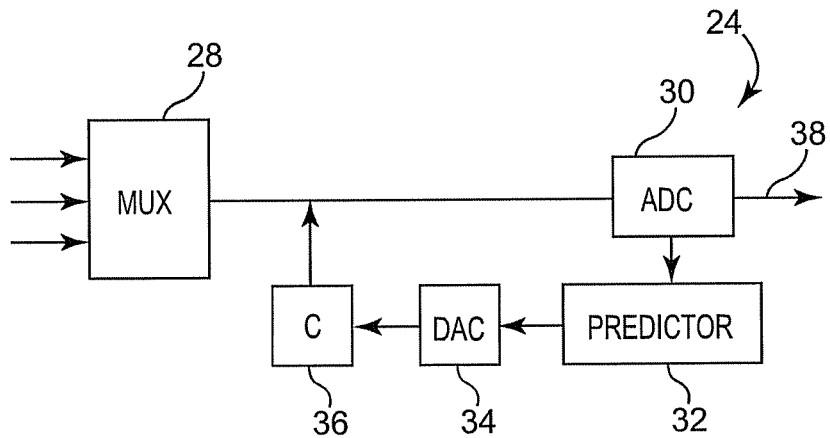
FIG. 2 is a more detailed schematic view of the predictive sensor readout feature in the semiconductor device of FIG. 1.

FIG. 2 illustrates a more detailed example of the readout circuit 24. The circuit 24 includes signal channels with sensor inputs provided to a multiplexer 28, which selects a channel and provides the corresponding input to an analog-to-digital converter (ADC) 30. The ADC 30 converts the analog signal from the multiplexer 28 into a digital signal that is provided to a predictor circuit 32. The predictor circuit 32 determines an approximation of the next input from the sensor, and provides the approximation to a digital-to-analog converter (DAC) 34. The DAC 34 creates an analog output corresponding with the digital input from the predictor 32. The DAC 34 provides the analog signal to a preset circuit 36, which pre-charges the preset circuit 36.

The operation of the circuit 24 is made with reference first to FIG. 2. The operation describes a method of providing a signal source, such as to the processor 26, with a system having multiplexed signal channels, such as from a plurality of sensors 22. The multiplexer can be eliminated if only one sensor is used. A signal channel is selected with the multiplexer 28 and provided to the ADC 30. The ADC 30 has previously sampled signals from the selected sensor, which includes a plurality of previously digitized samples stored as a signal history. The signal history is used to predict the actual signal from the sensor. One or more signals are used to determine an estimated sensor signal, which is a prediction of the actual signal. The estimated signal is provided to the DAC 34, which then converts the estimated signal from digital form into an estimated amount of voltage representative of the estimated signal. The estimated amount of voltage is used to pre-charge the preset circuit 36 so as to reduce the time needed, and other circuitry involved, when the actual signal is readout. The ADC 30 provides a digital signal representative of the actual signal as an output 38.

In one example, the preset circuit 36 includes a capacitor, which is pre-charged to an estimated amount of voltage so when the actual signal is readout, the voltage required on the capacitance is only the difference between the estimated amount of voltage and the actual input voltage. This voltage difference is relatively smaller compared to applying the actual voltage in the first instance to the capacitor, which is discharged or charged to a voltage that does not predict the next sample.

Figure 3:
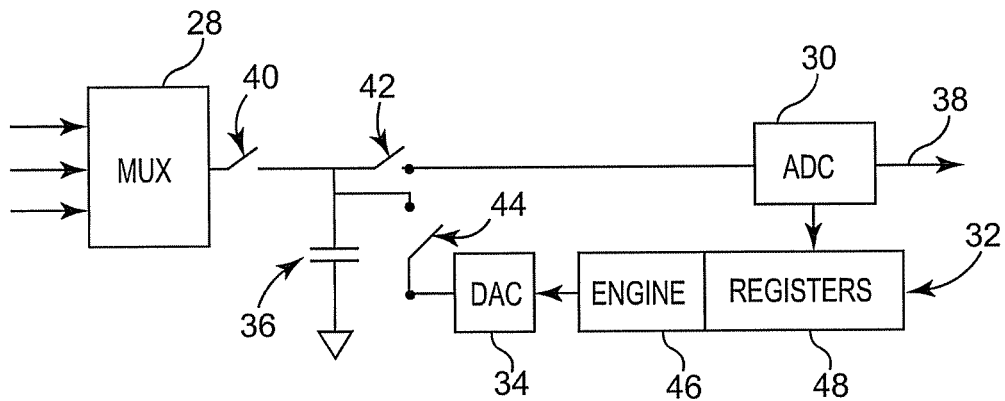
FIG. 3 is a schematic view of an example of the device of FIG. 2.

FIG. 3 illustrates a simple example of the readout circuit 24 referenced in FIG. 1. In addition to the elements described in FIG. 2, FIG. 3 includes three switches 40, 42, 44 and the predictor 32 includes a prediction engine 46 and a series of registers 48. The preset circuit 36 is represented by a capacitor coupled to a base voltage such as ground, and the capacitor can be isolated from all or portions of the readout circuit 24 with the switches 40, 42, 44. Switch 40 couples the multiplexer 28 to the capacitor 36. Switch 42 couples the capacitor to the ADC 30. Switch 44 couples the capacitor to the DAC 36.

In operation of this example, the multiplexer 28 selects one of several different sensor channels. The register block 48 contains one set of registers for each input channel. At the same time, the predictor 32 selects the set of registers in the predictor 32 that corresponds to the selected input channel. The number of registers per channel corresponds to the order of the predictor. The registers of the chosen set are filled with the previously digitized samples of this channel. The prediction engine 46 calculates the prediction value for the sample to be taken. The predicted value is converted into an analog signal by the DAC 34 and the capacitor 36 is charged to the predicted value via the switch 44. All other switches are open. After the switch 44 is opened, switch 40 is closed and the sampling capacitor is connected to the input multiplexer. The capacitor is now pre-charged in preparation for the input. The amount of charge that is required from the sensor to change the voltage on the capacitor 36 depends on the precision of the prediction. For a good prediction the charge difference is very small and can be supplied even by a very high impedant sensor without significant voltage drop and in a short sampling time.

All other switches are open during the pre-sampling. After switch 40 is opened again, switch 42 is closed and the sampled input value that is stored on the capacitor is converted into the digital output value. The conversion result is stored in the selected set of registers in the predictor for this channel as the most recent sample, and the oldest sample drops out at the other end of the register chain. Now the registers remain unchanged until the channel is selected the next time. As other channels are selected, the same procedure runs in the same manner but with another input from the multiplexer and another set of registers for the prediction. In this example, the conversion sequence of all channels is fast enough so that every channel is oversampled. The predictor generates the predicted input as a digital signal that is then converted to the DAC as an estimated amount of voltage. The switch 44 is closed as the DAC provides the estimated amount of voltage to pre-charge the capacitor.

With a sufficient oversampling rate, the input voltage difference between the readout circuit 24 and a prior art sensor readout is a factor of one hundred or more in one embodiment. Similarly, the required charging current from the multiplexer 28 to the ADC 30 is reduced by the same factor and the actual signal from the selected sensor charges the voltage difference between the estimated amount of voltage pre-charged on the capacitor 36 and the actual amount of voltage in the actual signal of the sensor. With such a sufficiently low current in between the multiplexer and the sampling capacitor, the predictive readout system can be multiplexed in a fast sequence even if the sources supplying the signals are highly impedant, because the most of the charge to get the capacitor to the voltage level of another channel is supplied by the internal DAC.

Figure 4:
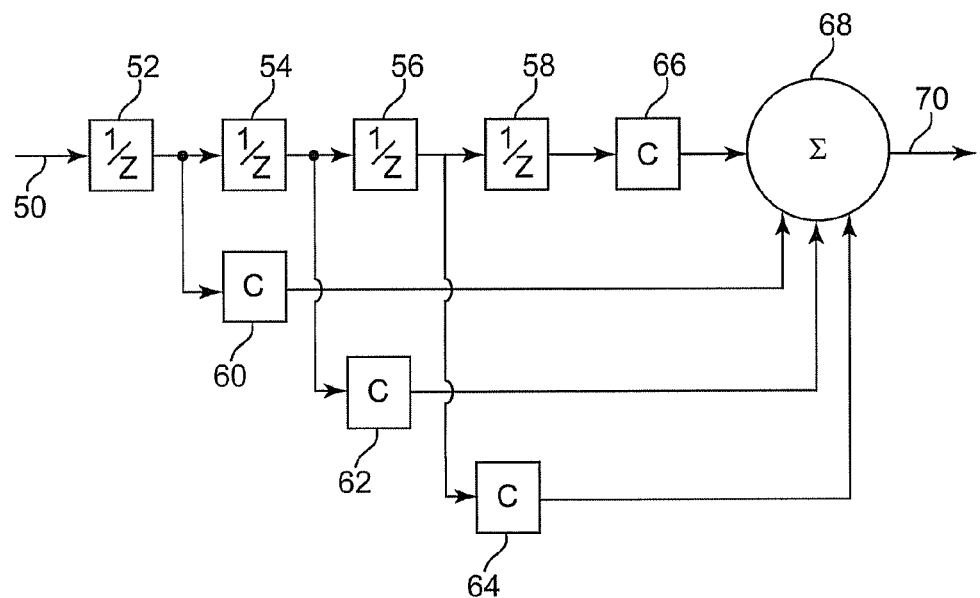
FIG. 4 is a schematic view of an example finite impulse response (FIR) filter, which is an example of a feature of the device of FIG. 2.

FIG. 4 illustrates an example of a prediction engine 46 which can be constructed as a finite impulse response (FIR) filter. An input signal 50 is provided from the ADC 30 and is passed through the register block 48, which can function as a series of unit delay elements such as 52, 54, 56, and 58. The output signal of each of the delay elements is applied to the inputs of the coefficient elements illustrated as 60, 62, 64, and 66. A summation is formed at summing junction 68 resulting in an output 70, which can then be provided to the DAC 34.

The example FIR filter is a linear predictor. The transfer function of the example prediction engine 46 results in $$H(z)=4z^{-1}-6z^{-2}+4z^{-3}-z^{-4}$$

According to this function, coefficient element 60 provides the signal output from delay element 52 with a multiplier of (4); coefficient element 62 provides the signal output from the delay element 54 with a multiplier of (−6); coefficient element 64 provides the signal output from the delay element 56 with a multiplier of (4); and coefficient element 66 provides the signal output from the delay element 58 with a multiplier of (−1). The number of coefficient elements and delay units as well as the multiplier of the coefficient elements can be changed depending on the transfer function used when the predictor is a FIR filter.

The transfer function can relate to the accuracy of the predictor. The simplest predictor, or a zero order predictor, merely uses the last sample as an estimation for the actual signal and has a transfer function of $z^{-1}$. If the signal is highly oversampled by a factor of OSR (oversampling rate) and the ADC 30 is still able to sample signals that quickly, then the maximum difference of the actual signal and the previous one is the quantization range divided by the OSR. The higher order predictors can improve the estimated values by including derivations of the previous samples. The signal history can include the previous samples so that higher order predictors can be used in this example.

Figure 5:
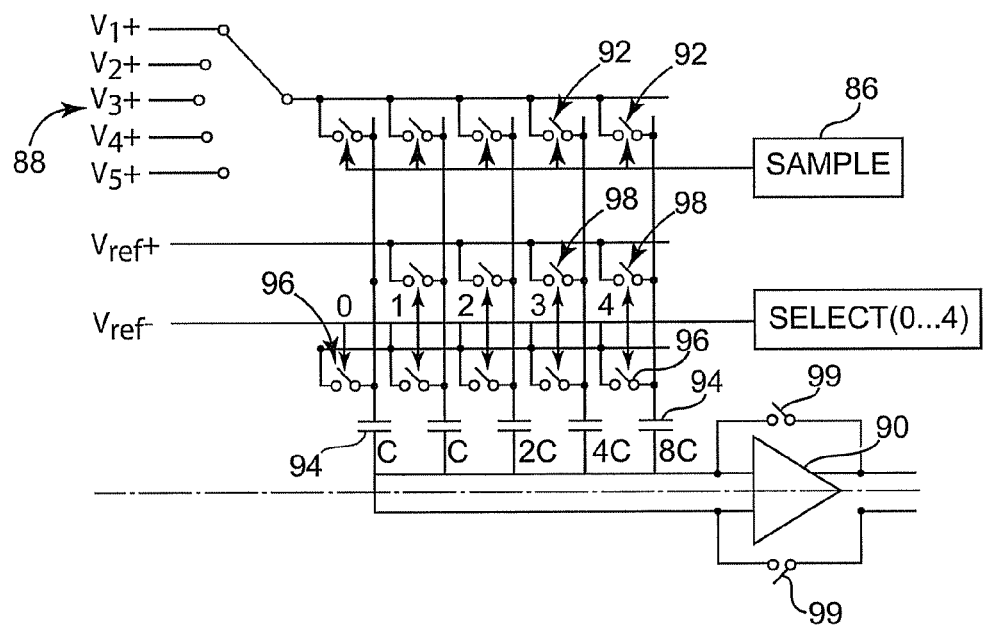
FIG. 5 is a schematic view of an example successive approximation register analog to digital converter, which is an example of a feature of the device of FIG. 2.

FIG. 5 illustrates a sampling network of a four-bit successive approximation register analog to digital converter (SAR ADC), which is an example of the feedback path. The figure illustrates and describes the "positive" path of a differential network for simplicity. The negative path is fully symmetrical and can be appreciated by one skilled in the art. A standard SAR converter 86 samples an input voltage ($V_n$) 88 with reference to a virtual ground voltage of a comparator 90 with feed back switches 99 and sampling switches 92, closed. Afterwards, the sampling switches 92 and feedback switch 99 are opened and the cumulative charge stored on the preset circuit 94, such as a capacitor network, is no longer changed.

The conversion of the analog signal to a digital one is accomplished by connecting the switches to $V_{ref}-$, such as switch 96, and successively testing the bits 88 to determine which bit(s) have to be switched to $V_{ref}+$, such as with switch 98, in order to invert the sign of the comparator input voltage. The conversion begins with the most significant bit. This is repeated for each bit from the most significant bit to the least significant bit. The settings of the selection switches, such as 96 and 98, represent the conversion result. For example, a selection switch indicating $V_{ref}+$ for one bit represents a digital signal of one for that bit. A selection switch indicating $V_{ref}-$ for one bit represents a digital signal of zero for that bit.

In one example, the predicted actual signal is applied to the selection switches for an additional pre-charge phase. During pre-charge, the feed back switches 99 on the comparator 90 are closed and the capacitors are charged to:

$$Q_{predicted}=(predicted)*C*V_{ref}-(16-predicted)*C*V_{ref}$$

where Q is charge, predicted is the predicted value for the actual signal, $V_{ref}$ is the difference between $V_{ref}+-V_{ref}-$, and C is the unit capacitor.

After the pre-charge phase the capacitor network 94 is connected to the actual input for sampling, which is done in the same way as for the standard SAR converter. The difference is that the cumulative charge on the sampling capacitor network is already close to the final value due to the precharging phase.

Figure 6:
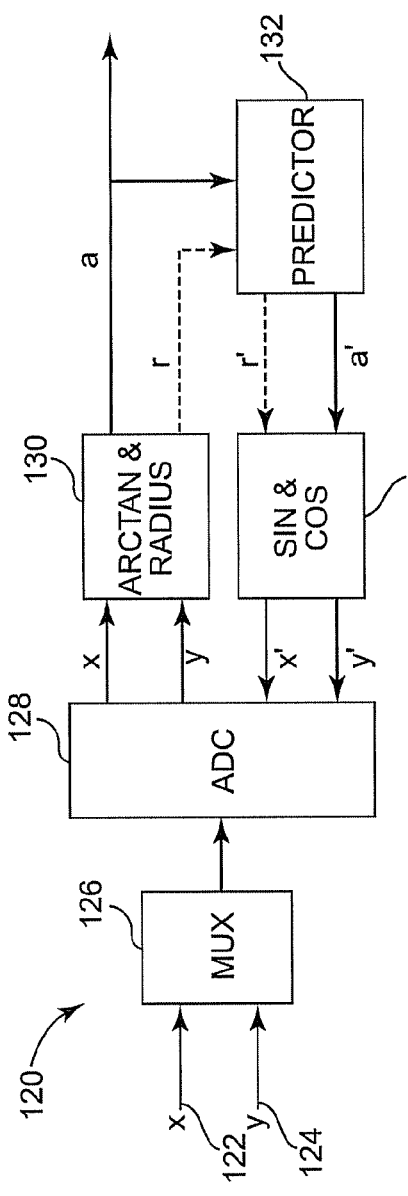
FIG. 6 is a schematic view of an implementation of the device of FIG. 2.

FIG. 6 illustrates a general overview of an example implementation of the sensor readout in use with at least one angular sensor to form a sensor circuit 120. An analog x value 122 and a y value 124 measurement signals of a given trajectory are provided from a field sensor (not shown) to a multiplexer 126. In one example, the trajectory is circular. The multiplexer selects a value and provides it to an analog to digital converter (ADC) 128. In an example feature, the multiplexer 126 alternates between providing an x value and a y value to the ADC 128.

The ADC 28 converts analog signal x and y values 122, 124 to digital signal x and y components, and then provides the x and y components to a linear to angular converter circuit 130. The converter circuit 130 receives the linear components of (x, y) and changes them into digital signals with corresponding angular or circular components (angle, radius). The angular components (a, r) are provided to a predictor 132 that estimates the next point along the trajectory. The predictor 132 provides predicted angle and radius components (a', r') to an angular to linear converter 134. The angular to linear converter 134 receives the digital angular signal components of the predicted angle and radius components and changes them into digital signals with corresponding predicted x and y components (x', y'). The predicted x and y components are provided to the ADC 128, where they will be used to anticipate the next value provided from the multiplexer 126. Actual outputs from the sensor circuit 120 can be in digital linear or angular form depending on the design of additional circuitry.

The linear to angular converter 130 and angular to linear converter 134 are used in one example instead of predicting linear components directly. The linear to angular converter 130 receives the x and y components and applies a function to determine corresponding arctangent and radius values as part of the conversion. Similarly, the angular to linear converter 134 receives predicted angular and radius components and applies a function to determine corresponding sine and cosine values as part of the conversion. The application of the converters 130, 134 can improve the efficiency of the predictor 32. Measured values including sine and cosine, which are present in linear measurements, are highly non-linear even if the angle rotation is at a constant speed or changes at a relatively low rate. This additional non-linearity is avoided if angle and radius measurements are provided to the predictor 32. A simpler predictor can be used for angular components with same or similar accuracy in prediction than for linear components.

In one example, the radius of a rotation vector of the trajectory can be assumed not to change, or not to change significantly, to further simplify the predictor 132. This assumption can be made in situations such as with magnetic field sensor devices where the radius represents field strength of the magnet multiplied by the sensitivity to change. Both of these change only with ambient temperature change or with aging and thus have a relatively low bandwidth. If this assumption is used in a particular circuit, the angle component and not the radius is provided to the predictor. In this example, the linear predictor can be made to be simpler than if both angular components are provided. This example is indicated in FIG. 6 where the radius predicted radius component is shown in phantom. One skilled in the art can leave in or take conversion of the radius component from the converters 130, 134, and leave in or take out a radius prediction engine from the predictor 132.

In some examples, the multiplexer 126 is provided with analog x and y values 122, 124 from a single field sensor. In other examples, two field sensors are used where one of the field sensors provides the x value 122 and the other of the field sensors provides the y value 124. In the case of two different sensors, the values of x and y actually originate from two differently measured trajectories, where the difference from a single measurement is characterized as an offset. Similarly, the two sensors could have different physical characteristics from each other thus affecting gain in the measured values. These aspects of offset and gain can be corrected prior to prediction to make the x and y components appear to include the same amplitude and origin, or otherwise appear to be provided from a single sensor.

Figure 7:
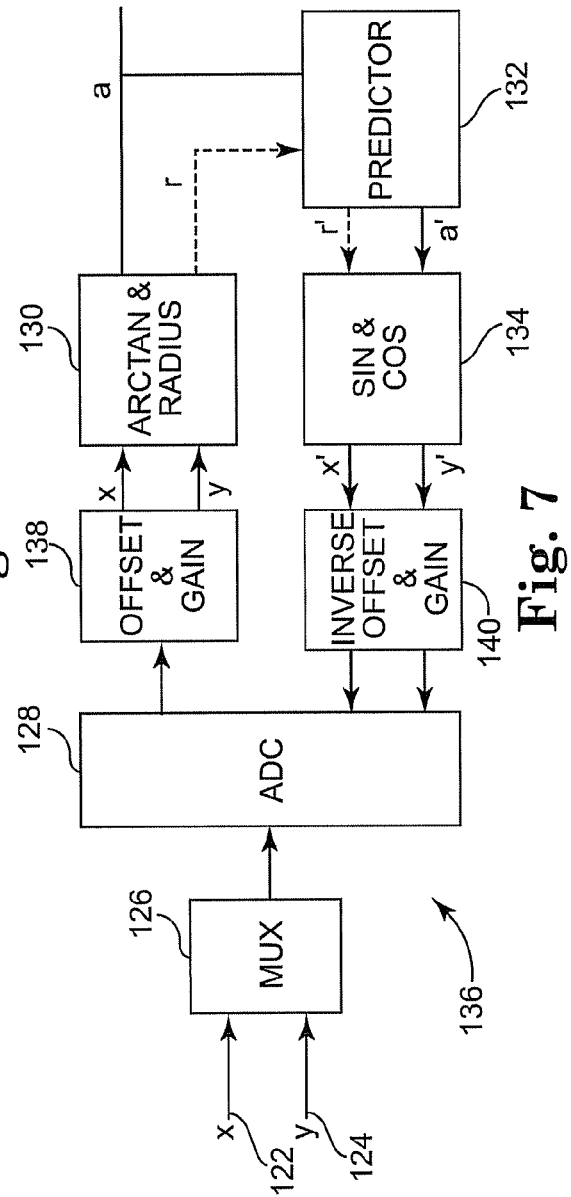
FIG. 7 is a schematic view of another implementation of the device of FIG. 2.

FIG. 7 illustrates a sensor circuit 136 that includes offset and gain correction. The example circuit 136 includes an offset and gain correction circuit 138, which corrects offset, gain, and other aberrations from "raw" digital x and y components so that the applied x and y components appear to be from the same sensor. The correction circuit 138 can apply a correction to one component or both depending on designer preference. Prior to providing the predicted x and y components to the ADC 128, the components are provided to an inverse offset and gain correction circuit 140, which will undo the effects of the correction of circuit 138, and create a predicted digital signal that corresponds with the same level as the "raw" digital x and y components.

The example ADC 128 receives the predicted x and y components (x', y'), whether corrected or not depending on the design, and converts the predicted components back into an analog signal. The analog signal of a predicted component is then subtracted from the next input from the multiplexer 126 of the corresponding component. The resulting difference is a "residual error" to the change of the next input from the multiplexer 126, and is quantized. The more accurate the prediction, the smaller the residuum, and the smaller the required quantization range of the ADC 128. The digital output of the ADC 128 is calculated by adding the predicted component to the quantized residuum. Other examples are known or can be later discovered yet still be within the scope of this disclosure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A predictive sensor readout comprising:
 a sampling circuit configured to receive and over-sample previously digitized samples of signal levels previously input from a sensor;
 a predictor coupled to the sampling circuit and configured to receive the over-sampled previously digitized samples into a signal history, and wherein the predictor is configured to apply the signal history to generate a predicted next input level representative of a signal level predicted to be input next from the sensor; and
 a preset circuit coupled to the predictor and the sampling circuit, and wherein the preset circuit is configured to preset the sampling circuit to the predicted next input level as generated by the predictor prior to sampling an actual next signal level input from the sensor.

2. The predictive sensor readout of claim 1 wherein the sampling circuit includes a capacitor coupled to the preset circuit and the capacitor is configured to be pre-charged with a predicted next voltage based on the predicted input prior to sampling and charging to an actual voltage based on the actual next signal.

3. The predictive sensor readout of claim 1 wherein the sampling circuit is configured to receive multiplexed inputs from a plurality of sensors.

4. The predictive sensor readout of claim 1 wherein the sampling circuit includes an analog to digital converter.

5. The predictive sensor readout of claim 4 wherein the analog to digital converter comprises a successive approximation register analog to digital converter.

6. The predictive sensor readout of claim 5 wherein the successive approximation register analog to digital converter includes a capacitor network.

7. The predictive sensor readout of claim 6 wherein the capacitor network includes a plurality of capacitors and is configured to be pre-charged by selectively coupling the plurality of capacitors to reference inputs based on the predicted next input level.

8. The predictive sensor readout of claim 1 wherein the predictor is a finite impulse response filter.

9. The predictive sensor readout of claim 8 wherein the finite impulse response filter includes a plurality of delay elements, a plurality of coefficient elements, and a summing junction.

10. The predictive sensor readout of claim 9 wherein the plurality of delay elements are registers configured to store the signal history.

11. The predictive sensor readout of claim 9 further comprising a pre-charge circuit, wherein the summing junction of the predictor provides a digital output to the pre-charge circuit.

12. The predictive sensor readout of claim 11 wherein the pre-charge circuit includes a digital to analog converter coupled between the predictor and the sampling capacitor.

13. The predictive sensor readout of claim 1 further comprising a pre-charge circuit coupled between the predictor and the capacitor, the pre-charge circuit configured to apply a selected voltage to the capacitor.

14. The predictive sensor readout of claim 13 wherein the pre-charge circuit includes a digital to analog converter configured to receive the predicted input from the predictor and to provide the selected voltage as an output to the capacitor.

15. A predictive sensor readout coupled to a plurality of sensors, the predictive sensor readout comprising:
 an analog to digital converter configured to receive a series of signals from a selected sensor of the plurality of sensors and to generate a digital output of a series of digital signals based on the input of the series of signals; and
 a feedback circuit coupled to the analog to digital converter and configured to receive the series of digital signals, wherein the feedback circuit includes:
 a predictor circuit coupled to the analog to digital converter, wherein the predictor circuit is configured to receive an over sampled input of the series of digital signals, and wherein the predictor circuit is configured to apply the series of digital signals to generate a digital predicted next signal representative of a particular signal predicted to be received next from the selected sensor;

a digital to analog converter coupled to the predictor circuit, wherein the digital predicted next signal as generated by the predictor circuit is converted to an analog representation of the digital predicted next signal; and a sampling circuit coupled to the digital to analog converter and configured to be pre-charged with the analog representation of the digital predicted next signal, and wherein the sampling circuit it is configured to receive a next signal from the selected sensor after the sampling circuit is charged to the analog representation of the predicted next signal.

16. The predictive sensor readout of claim 15 wherein the analog to digital converter includes a successive approximation register analog to digital converter.

17. The predictive sensor readout of claim 16 wherein the successive approximation register analog to digital converter includes a capacitor network configured as the sampling circuit to be pre-charged with the analog representation of the digital predicted actual output signal.

18. The predictive sensor readout of claim 17 wherein the predictor circuit includes a finite impulse response filter.

19. A method of preparing for a sensor output from a sensor into a sensor readout, the method comprising:

receiving a series of samples representative of an output from the sensor through a sensor sampling circuit of the sensor readout, the sampling circuit pre-charged with a voltage;

storing a series of previously digitized samples from the sensor in a predictor circuit of the sensor readout;

predicting the sensor output from the series of previously digitized samples to obtain a predicted next output of the sensor with the predictor circuit of the sensor readout, the predictor circuit generating a predicted next input level representative of a signal level predicted to be output next from the sensor to the sensor sampling circuit;

converting the predicted next output into an amount of voltage corresponding with the predicted next input level; and pre-charging the sensor sampling circuit with an estimated amount of voltage prior to sampling a next output from the sensor with the sensor readout.

20. The method of claim 19 wherein the stored previous samples and predicted output are represented as digital signals.

21. The method of claim 20 wherein the converting includes providing the predicted output to a digital to analog converter, wherein the estimated amount of voltage is an analog signal representation of the digital signal representation of predicted output.

22. The method of claim 19 wherein predicting includes oversampling the series of previous samples.

23. The method of claim 19 wherein a plurality of sensors are coupled to the sensor readout through a multiplexer.

24. A method of preparing for an input from a sensor with a sensor readout, the method comprising:

receiving a series of sensor signals representative of an output from the sensor through a sensor sampling circuit sensor readout, the sampling circuit pre-charged with a voltage;

oversampling the series of sensor signals to generate a digital signal history;

generating, with a predictor circuit, a predicted next input level representative of a signal level predicted to be output next from the sensor to the sensor sampling circuit based on the digital signal history; and pre-charging the sensor sampling circuit with the predicted next input level generated with the predictor circuit.

* * * * *